(12) United States Patent
Dowling et al.

(10) Patent No.: US 9,337,426 B2
(45) Date of Patent: May 10, 2016

(54) METHOD FOR INK JET PRINTING ORGANIC ELECTRONIC DEVICES

(75) Inventors: Mark Dowling, Elsworth (GB); Mark Ian Crankshaw, Royston (GB)

(73) Assignee: CAMBRIDGE DISPLAY TECHNOLOGY LIMITED, Cambridgeshire (GB)

(*) Notice: Subject to any disclaimer, the term of this patent is extended or adjusted under 35 U.S.C. 154(b) by 707 days.

(21) Appl. No.: 13/061,445

(22) PCT Filed: Sep. 15, 2009

(86) PCT No.: PCT/GB2009/002214
§ 371 (c)(1),
(2), (4) Date: Apr. 6, 2011

(87) PCT Pub. No.: WO2010/029321
PCT Pub. Date: Mar. 18, 2010

(65) Prior Publication Data
US 2011/0198661 A1 Aug. 18, 2011

(30) Foreign Application Priority Data
Sep. 15, 2008 (GB) .................................. 0816845.2

(51) Int. Cl.
*H01L 51/00* (2006.01)
*H01L 27/32* (2006.01)

(52) U.S. Cl.
CPC ......... *H01L 51/0005* (2013.01); *H01L 27/3244* (2013.01)

(58) Field of Classification Search
USPC .......................................................... 427/64
See application file for complete search history.

(56) References Cited

U.S. PATENT DOCUMENTS

| 4,539,507 | A | 9/1985 | VanSlyke et al. |
| 6,508,535 | B1 * | 1/2003 | Klassen .......................... 347/41 |
| 6,878,312 | B1 | 4/2005 | Kanbe et al. |
| 2003/0186613 | A1 | 10/2003 | Kawase |

(Continued)

FOREIGN PATENT DOCUMENTS

| EP | 0 880 303 A1 | 11/1998 |
| WO | WO-90/13148 A1 | 11/1990 |

(Continued)

OTHER PUBLICATIONS

Duineveld et al., "Ink-Jet Printing of Polymer Light-Emitting Devices," Proceedings of SPIE, 4464 (2002).

(Continued)

*Primary Examiner* — Robert Vetere
(74) *Attorney, Agent, or Firm* — Marshall, Gerstein & Borun LLP

(57) ABSTRACT

A method of fabricating an organic electronic device using ink jet printing in swathes, comprises depositing an ink into a first set of locations in a column in a first print pass; wherein the first set of locations is less than a total number of locations in the column; and depositing an ink into a second set of locations in the column in a subsequent print pass; wherein the second set of locations is less than a total number of locations in the column. Preferably the number of nozzles used to fill all locations in a column is equal to the number of print passes needed to print the column. All locations in the swathe are printed after all print passes using a regular repeating randomized pattern, such that be ensured that print locations are not under filled, or over filled.

32 Claims, 12 Drawing Sheets

(56) References Cited

U.S. PATENT DOCUMENTS

| | | | |
|---|---|---|---|
| 2004/0081768 A1* | 4/2004 | Furusawa et al. | 427/421 |
| 2004/0223027 A1* | 11/2004 | Shinkawa et al. | 347/23 |
| 2005/0019483 A1 | 1/2005 | Kawase et al. | |
| 2005/0257738 A1* | 11/2005 | Tateishi et al. | 118/300 |
| 2006/0145365 A1* | 7/2006 | Halls et al. | 257/E51.022 |
| 2006/0176335 A1* | 8/2006 | Chung et al. | 347/40 |
| 2007/0069634 A1* | 3/2007 | Carmon et al. | 313/504 |
| 2007/0075626 A1* | 4/2007 | Yu et al. | 313/500 |

FOREIGN PATENT DOCUMENTS

| | | |
|---|---|---|
| WO | WO-95/06400 A1 | 3/1995 |
| WO | WO-99/21935 A1 | 5/1999 |
| WO | WO-99/48160 A1 | 9/1999 |
| WO | WO-00/59267 A1 | 10/2000 |
| WO | WO-01/16251 A1 | 3/2001 |
| WO | WO-02/18513 A1 | 3/2002 |
| WO | WO-02/067343 A1 | 8/2002 |
| WO | WO-03/100860 A2 | 12/2003 |
| WO | WO-2004/002746 A1 | 1/2004 |
| WO | WO-2004/050260 A2 | 6/2004 |
| WO | WO-2005/076386 A1 | 8/2005 |

OTHER PUBLICATIONS

Yang, "Polymer Light-Emitting Logos Processed by the Ink-Jet Priting Technology," SPIE Photonics West: Optoelectronics Conf. 3279 (1998).

International Preliminary Report on Patentability for Application No. PCT/GB2009/002214, dated Mar. 15, 2011.

International Search Report and Written Opinion for Application No. PCT/GB2009/002214, dated Apr. 6, 2010.

Search Report for Application No. GB0816845.2, dated Dec. 20, 2008.

* cited by examiner

METHOD FOR INK JET PRINTING ORGANIC ELECTRONIC DEVICES

This invention generally relates to methods of fabricating organic electronic devices such as organic light emitting diodes (OLEDs) by droplet deposition techniques such as ink jet printing. The invention also relates to organic electronic device substrates fabricated by and/or used in such methods.

BACKGROUND OF THE INVENTION

Organic light emitting diodes (OLEDs) are a particularly advantageous form of electro-optic display. They are bright, colorful, fast-switching, provide a wide viewing angle and are easy and cheap to fabricate on a variety of substrates. Organic (which here includes organometallic) LEDs may be fabricated using either polymers or small molecules in a range of colors (or in multi-colored displays), depending upon the materials used. A typical OLED device comprises two layers of organic material, one of which is a layer of light emitting material such as a light emitting polymer (LEP), oligomer or a light emitting low molecular weight material, and the other of which is a layer of a hole injecting material such as a polythiophene derivative or a polyaniline derivative.

Organic LEDs may be deposited on a substrate in a matrix of pixels to form a single or multi-color pixelated display. A multi-colored display may be constructed using groups of red, green, and blue emitting pixels. So-called active matrix displays have a memory element, typically a storage capacitor and a transistor, associated with each pixel while passive matrix displays have no such memory element and instead are repetitively scanned to give the impression of a steady image.

FIG. 1 shows a vertical cross-section through an example of a prior art OLED device 100. In an active matrix display part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminum, sometimes referred to as anode metal. Glass substrates coated with ITO and contact metal may be purchased from Corning, USA. The contact metal (and optionally the ITO) is patterned as desired, and so that it does not obscure the display, by a conventional process of photolithography followed by etching.

A substantially transparent hole injection layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells 114 thus define light emitting areas or pixels of the display.

A cathode layer 110 is then applied by, say, physical vapor deposition. A cathode layer typically comprises a low work function metal such as calcium or barium covered with a thicker, capping layer of aluminum and optionally including an additional layer immediately adjacent the electroluminescent layer, such as a layer of lithium fluoride, for improved electron energy level matching. Mutual electrical isolation of cathode lines may achieved through the use of cathode separators. Typically a number of displays are fabricated on a single substrate and at the end of the fabrication process the substrate is scribed, and the displays separated before an encapsulating can is attached to each to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999. In the case of a polymer-based OLED layers 108 typically comprise a hole injection layer 108a and a light emitting polymer (LEP) electroluminescent layer 108b. A further hole transport layer (not shown) may be provided between hole injection layer 108a and electroluminescent layer 108b. The electroluminescent layer may comprise, for example, around 70 nm (dry) thickness of PPV (poly(p-phenylenevinylene)) and the hole injection layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

A volatile solvent is generally employed to deposit a molecular electronic material (typically an organic semiconducting material), with 0.5% to 4% dissolved solvent material. This can take anything between a few seconds and a few minutes to dry and results in a relatively thin film in comparison with the initial "ink" volume. Often multiple drops are deposited, preferably before drying begins, to provide sufficient thickness of dry material. Solvents which may be used include cyclohexylbenzene and alkylated benzenes, in particular toluene or xylene; others are described in WO 00/59267, WO 01/16251 and WO 02/18513; a solvent comprising a blend of these may also be employed.

FIG. 2, which is taken from WO2005/076386 (hereby incorporated by reference), shows a view from above (that is, not through the substrate) of a portion of a three-color active matrix pixelated OLED display 200 after deposition of one of the active color layers. FIG. 2 shows an array of banks 112 and wells 114 defining pixels of the display. The wells 114 are formed as apertures in a continuous layer or sheet.

Techniques for the deposition of material for organic light emitting diodes (OLEDs) using ink jet printing techniques are described in a number of documents including, for example, Y. Yang, "Review of Recent Progress on Polymer Electroluminescent Devices," *SPIE Photonics West: Optoelectronics* '98, Conf. 3279, San Jose, January, 1998; EP O 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

Precision ink jet printers such as machines from Litrex Corporation of California, USA are used; suitable print heads are available from Xaar of Cambridge, UK and Spectra, Inc. of NH, USA. A typical print head is more clearly in FIG. 3. The print head 222 has a plurality of nozzles 227, typically orifices in a nozzle plate for ejecting droplets of fluid from the print head onto the substrate. A fluid supply for printing (not shown) may either be provided by a reservoir within the print head 222 or print head unit or fluid may be supplied from an external source. In the illustrated example the print head 222 has a single row 228 of nozzles 227, but in other examples of print heads more than one row of nozzles may be provided with nozzles offset in one or two dimensions. The diameter of the orifices of nozzles 227 is typically between 10 μm and 100 μm, and drop sizes are similar. The space or pitch between adjacent nozzle orifices is typically between 50 μm and 100 μm.

Printers using such print heads 222 automatically divide up the print area of the display into a number of swathes and print these in succession as shown schematically in FIGS. 4a and 4b following. This is because a normal display panel has more pixels in its width than a print head can print in a single print pass. For example, some prior art printers have 128 nozzles, but normally only 80 are used in a single print pass.

FIG. 4a is a diagram showing the printing of swathes as known in the art. There is shown a first swathe 10, a second swathe 11 and a third swathe 12, as well as the order in which they are printed. FIG. 4b shows a conventional printing strategy in which print head 222 prints successive swathes 302, 304 in the Y-direction, stepping in the X-direction between each swathe. The technique illustrated in FIGS. 4a and 4b may be employed to produce a finer dot pitch. The print head is positioned at an angle Φ to the X-direction to reduce the dot pitch by a factor of cos Φ. Generally the size or volume distribution of drops is non-uniform, increasing or falling off at nozzles at the edge of the print head (that is, near an end of a row of nozzles), and further non-uniformity arise from small variations in nozzle heights.

Some of the problems with prior art swathe printing are described following:

As previously explained, to deposit a molecular electronic material a volatile solvent such as toluene or xylene is employed with 1-2% dissolved solvent material. This results in a relatively thin film in comparison with the initial "ink" volume. The drying time is dependent upon the solvent mix and the atmosphere above the substrate, but typically varies between a few seconds and some minutes. It is strongly preferable all the drops comprising material which are eventually to make up a pixel are deposited before drying begins.

Solvent drying effects make the appearance of pixels on the edge of a swathe subtly different to those in the centre of a swathe, as drops along the edge of a swathe dry faster and where the drop is thinnest, more light is emitted by the display and a visible line can be seen. The printing of display panels in swathes results in a "striped" appearance within the display.

Such "swathe-edge" problems can be partially alleviated by the use of ink formulations designed to slow down the drying until all swathes are printed, or by tuning the driving of the pixels to drive those at swathe edges differently to other pixels—however both approaches are complex and have their own restrictions.

A second effect is usually caused by a malfunctioning nozzle which either puts down too little, or two much, ink. When depositing materials for molecular electronic devices such as OLEDs, there is a need for both high resolution, generally than better than that required for the best high resolution graphics, and accurate control of the volume of material deposited. For graphics applications it is drop placement that is significant and volume variations of 5 to 10% are acceptable. However, when constructing molecular electronic devices it is deposited "ink" volume which is important since this will determine the eventual film thickness which, for an OLED, impacts upon brightness and hence drive current and device lifetime. Thus it is desirable to achieve a volume variation of better than 2%, preferably better than 1%, across an entire OLED display.

Further, if the volume variation of one column in a swathe is out by more than 5% out compared to result of another, normal, column, this then can be seen by human eye. The result is a visible "swathe-line" that can be seen the length of the swathe and which is repeated in every swathe printed.

Some prior art printers try to mitigate some of these swathe effects by interlacing the printing of swathes in the print pattern. However, the interlacing pattern is a simple on-off pattern where every other pixel is printed in a first print pass and the remaining pixels are filled in a second print pass.

FIG. 4 which is a diagram showing the printing of swathes in an on-off print pattern as known in the art. There is as shown a first print pattern 20 and a second print pattern 21. Also shown is the result of two print passes using each print pattern in sequence, which is a fully filled swathe 22.

This method has been found to actually lead to more swathe-edge effect problems (because in effect there are now more, if not smaller, swathes) and further, swathe-line effects due to faulty nozzles still can not be compensated for.

Interlacing using more complex patterns of pixels positions is not known for the printing of display panels.

It is an aim of certain embodiments of the present invention to provide an improved method of ink jet printing display panels which overcomes, or at least mitigates, swathe-effect problems.

It is a further aim to provide an improved display panel.

SUMMARY OF THE INVENTION

In accordance with a first aspect of the present invention there is provided a method of fabricating an organic electronic device as specified in the claims.

Preferably, wherein after all print passes, all locations in the column have been printed once only and/or wherein in at least two different print nozzles are used to print the locations in the column.

Further preferably, wherein the first set of locations plus the second set of locations is equal to the total number of locations in the column and/or wherein the number of nozzles used to fill all locations in the column is equal to the number of print passes needed to fully print the column.

Also preferably, wherein 25%, 50% or 75% of the locations in a swathe are printed in the first, second, third and/or subsequent print pass and further, wherein all locations in the swathe are printed after all print passes.

Preferably, wherein 80 to 128 nozzles are used in each of the first, second, third or subsequent print passes and/or, wherein the nozzle diameter is between 10 μm and 100 μm and/or the nozzle pitch is between 50 μm and 100 μm.

Preferably, wherein the ink is a conductive material, or a conductive organic material and wherein the conductive organic material may be chosen from the list of: LEP, Interlayer, PEDOT or PEDOT:PSS and may further comprise a solvent taken from the list of: cyclohexylbenzene, an alkylated benzene, toluene or xylene.

Preferably wherein the locations are pixels defined by an electrode and wherein the pixels are in wells or channels.

Further preferably, wherein the wells and/or channels are defined by a resistive material.

In accordance with a second aspect of the present invention there is provided a an organic electronic device manufactured according to the first aspect.

In accordance with a second aspect of the present invention there is provided an organic light emitting diode manufactured according to the first aspect.

BRIEF DESCRIPTION OF THE DRAWINGS

The present invention will now be described in further detail, by way of example only, with reference to the accompanying drawings in which.

DETAILED DESCRIPTION OF PREFERRED EMBODIMENTS

Figure 6:
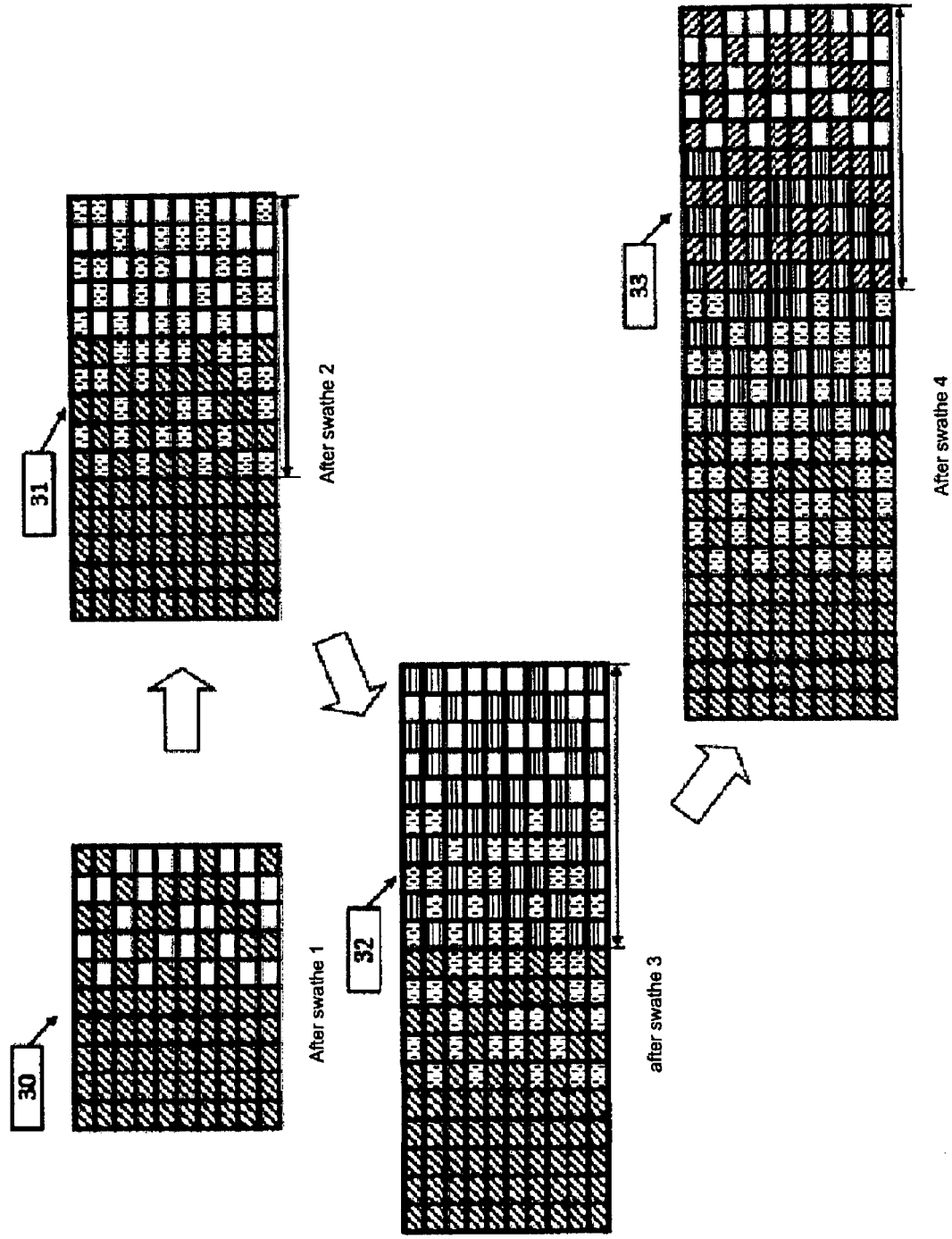
FIG. 6 is a diagram showing a random interlacing pattern, according to one embodiment of the present invention.

It has been found that an improved method to avoid the appearance of swathes is to overlap the neighboring swathes in a random manner, as shown in FIG. 6.

FIG. 6 is a random interlacing pattern, according to one embodiment of the present invention. There is shown a swathe pattern 30 after print pass 1, a swathe pattern 31 after print pass 2, a swathe pattern 33 after print pass 3 and swathe pattern 34 after print pass 4.

One problem in generating such a print pattern is that a fully random pattern does not assure that either a) each pixel is printed down once and once only and/or b) all pixels are printed at the end of all print passes and c) the same pixel is printed a pre-defined number of times into to get down the necessary volume of material to give the required color brightness.

It has also been found that with certain prior art printers, where a random print pattern is used which also takes into account that all pixels must be printed evenly, it becomes very difficult for the printer software control programs to be able to create a fully random "print recipe" or complex print pattern. This is because a complex pattern is required to be defined by the combination of simpler rectangular arrays of pixels, each array leading to an extra line within the software's layout file. In the extreme case of a totally randomized yet defined pattern, each printed pixel has to be defined by an array containing only one print position, leading to tens of thousands of such arrays. Typically, using more than 25 of these arrays per panel causes the printer software to crash.

However it has been found that an interlacing scheme for display printing works well when the interlaced pattern can be simply defined, i.e. it is based on a regular repeated randomized pattern, as described following.

Figure 7:
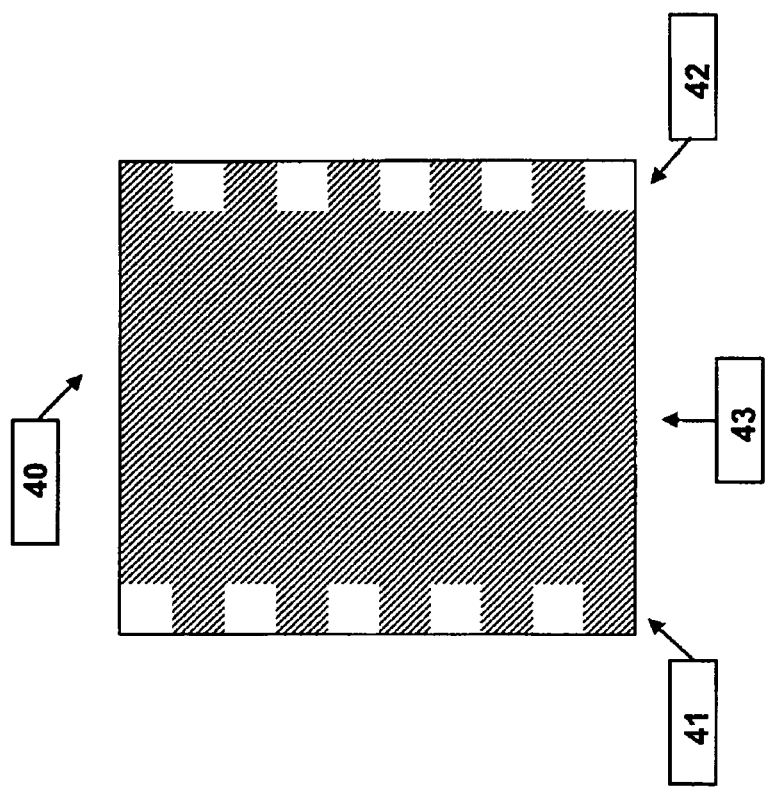
FIG. 7 is a diagram showing a first simple interlacing pattern, according to a second embodiment of the present invention.

FIG. 7 is a diagram showing a first simple interlacing pattern, according to a second embodiment of the present invention. There is shown a simple interlaced print pattern 40 which comprises a first on-off pattern 41 of locations down one column on the left hand side of the swathe, a central area 43 of fully filled locations and a second area of on-off pattern 42 in the final column on the right hand side. The second pattern 42 is the inverse or reverse of the first pattern 41.

A printer then may be given this pattern in a "bitmap" or "tif" formatted file and told to overlap the printing by one column at the start of each print pass. This results in all locations in the last column being filled by both the first and last nozzles used by the printer. This reduces the effect of a broken nozzle by 50% and also ensures that both nozzles must be broken to leave this column completely unfilled or over filled. This is very unlikely.

The method or pattern described with reference to FIG. 6 mitigates swathe-edge problems by "blurring" the edges (in effect), but not a swathe-line problem caused by a faulty nozzle (or nozzles) in the central area 43.

Figure 1:
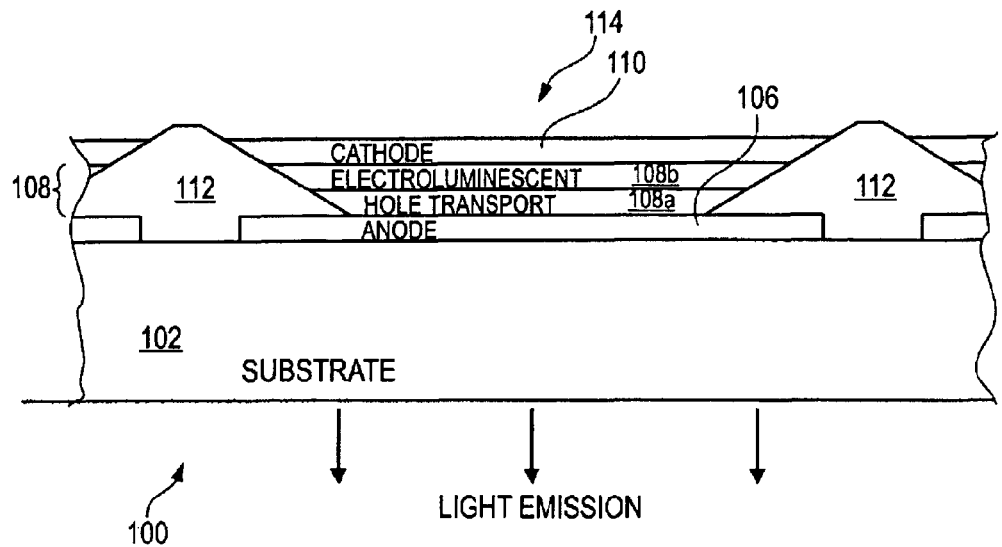
FIG. 1 shows a vertical cross-section through an example of a prior art OLED device.
Figure 2:
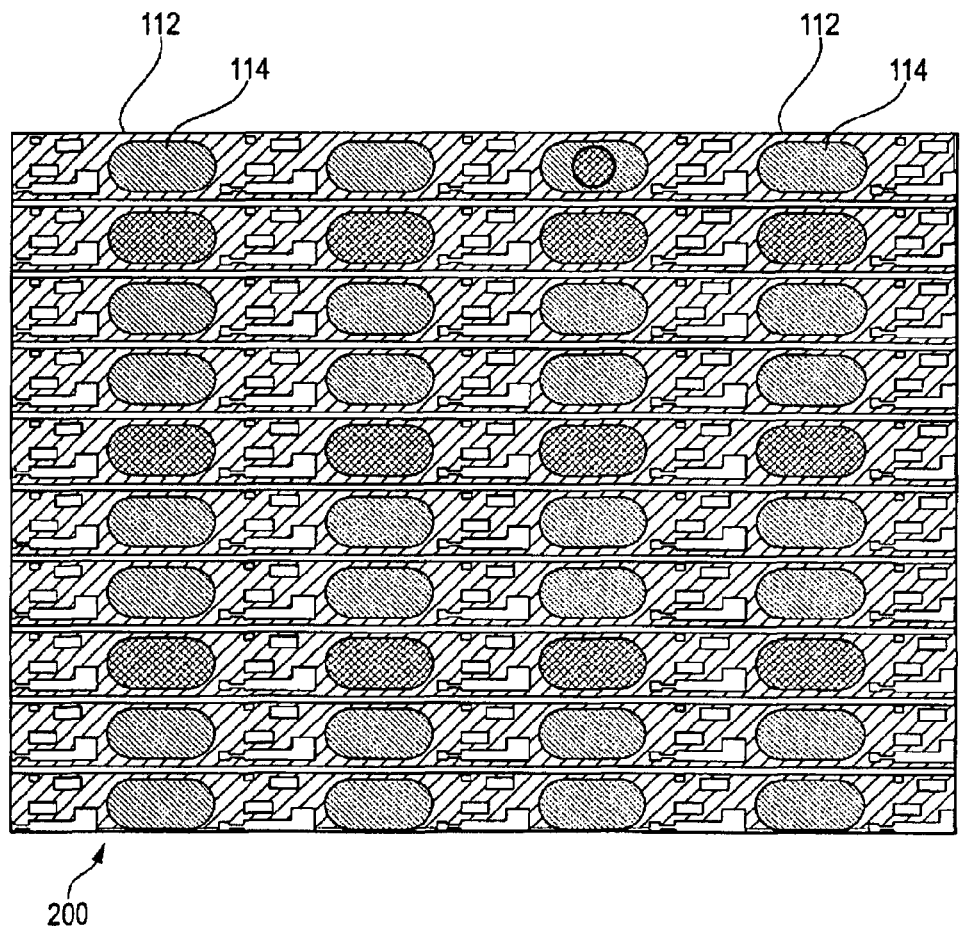
FIG. 2 shows a view from above of a portion of a prior art three color pixelated OLED display.
Figure 3:
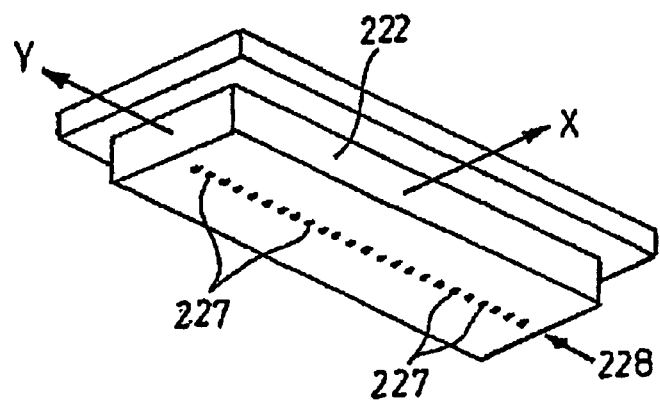
FIG. 3 is a diagram showing detail of an ink jet printer head as known in the art.
Figure 4A:
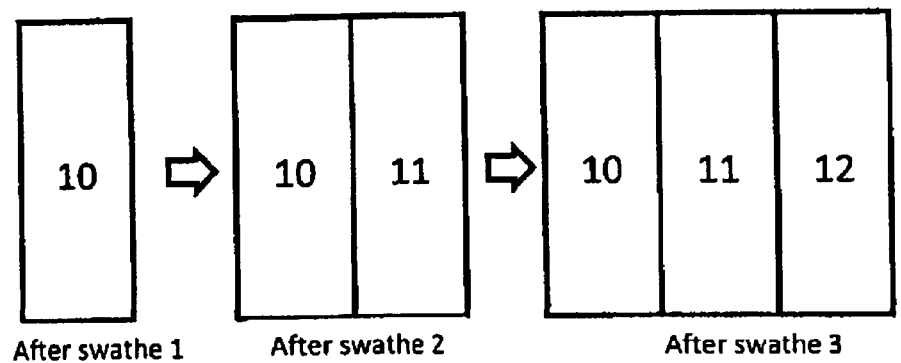
FIGS. 4a and 4b are diagrams showing the printing of swathes as known in the art.
Figure 4B:
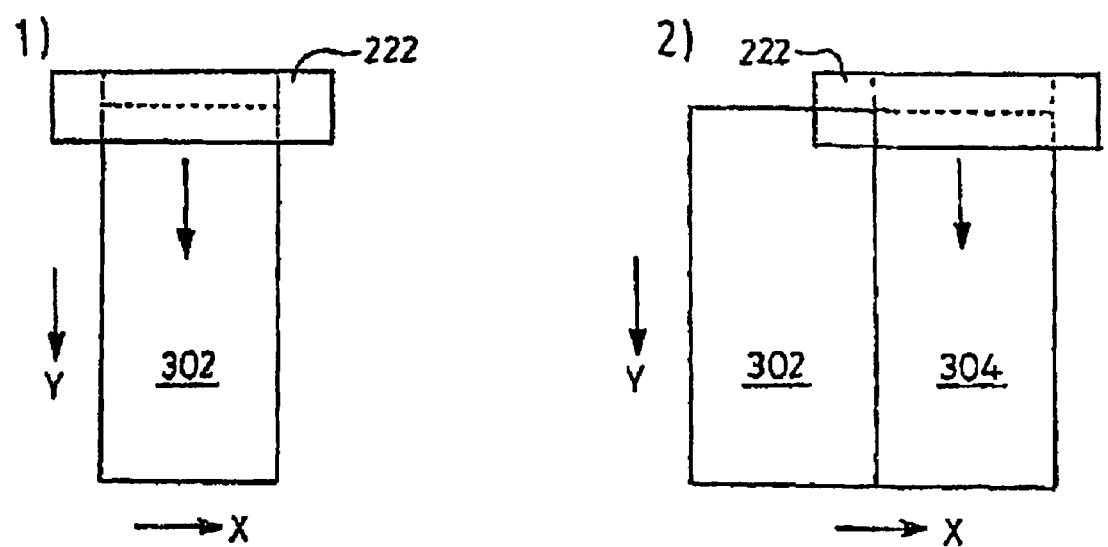
Figure 8A:
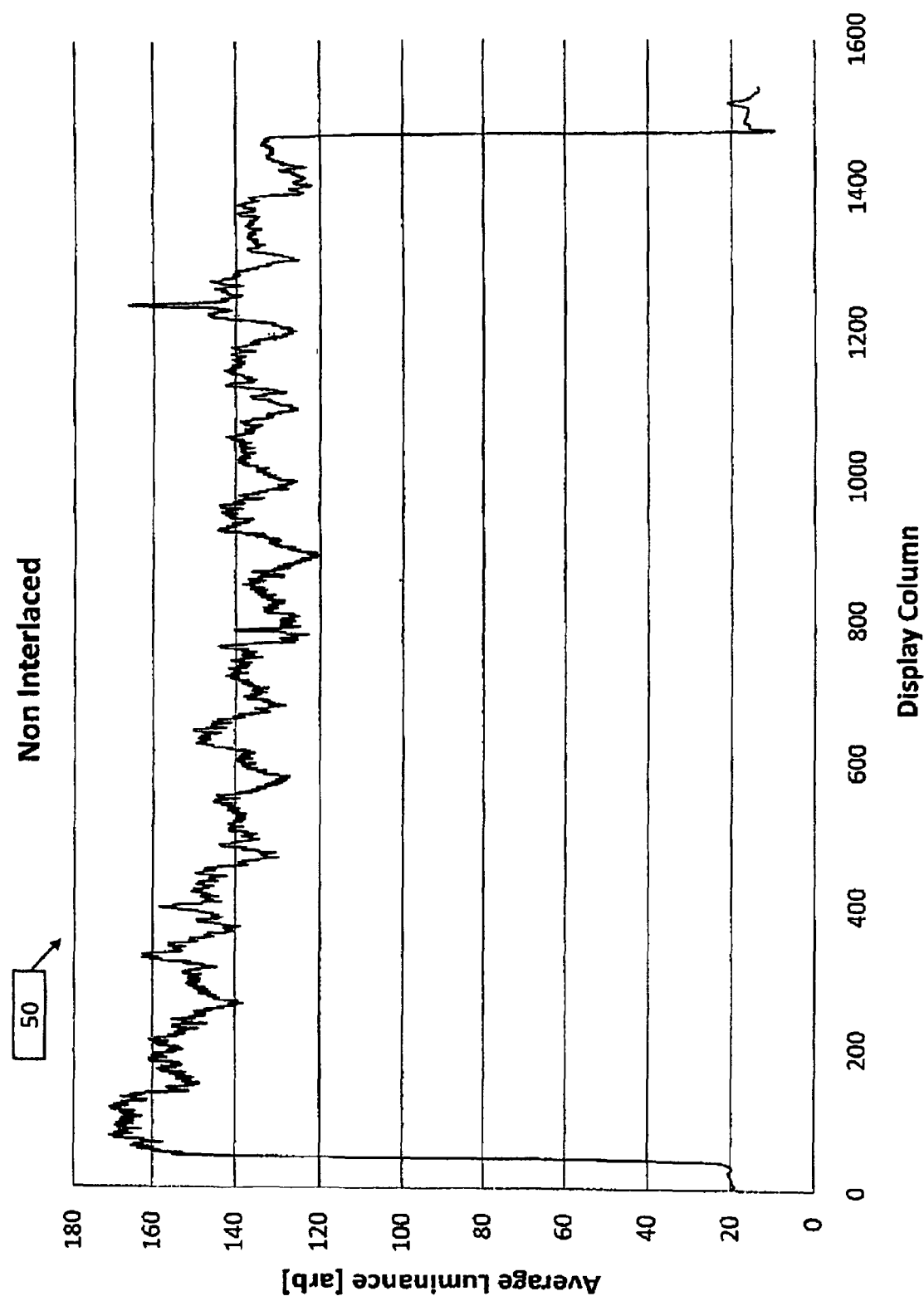
FIGS. 8a and 8b are graphs showing improved average luminance vs display column for the first simple interlacing pattern of FIG. 7.
Figure 8B:
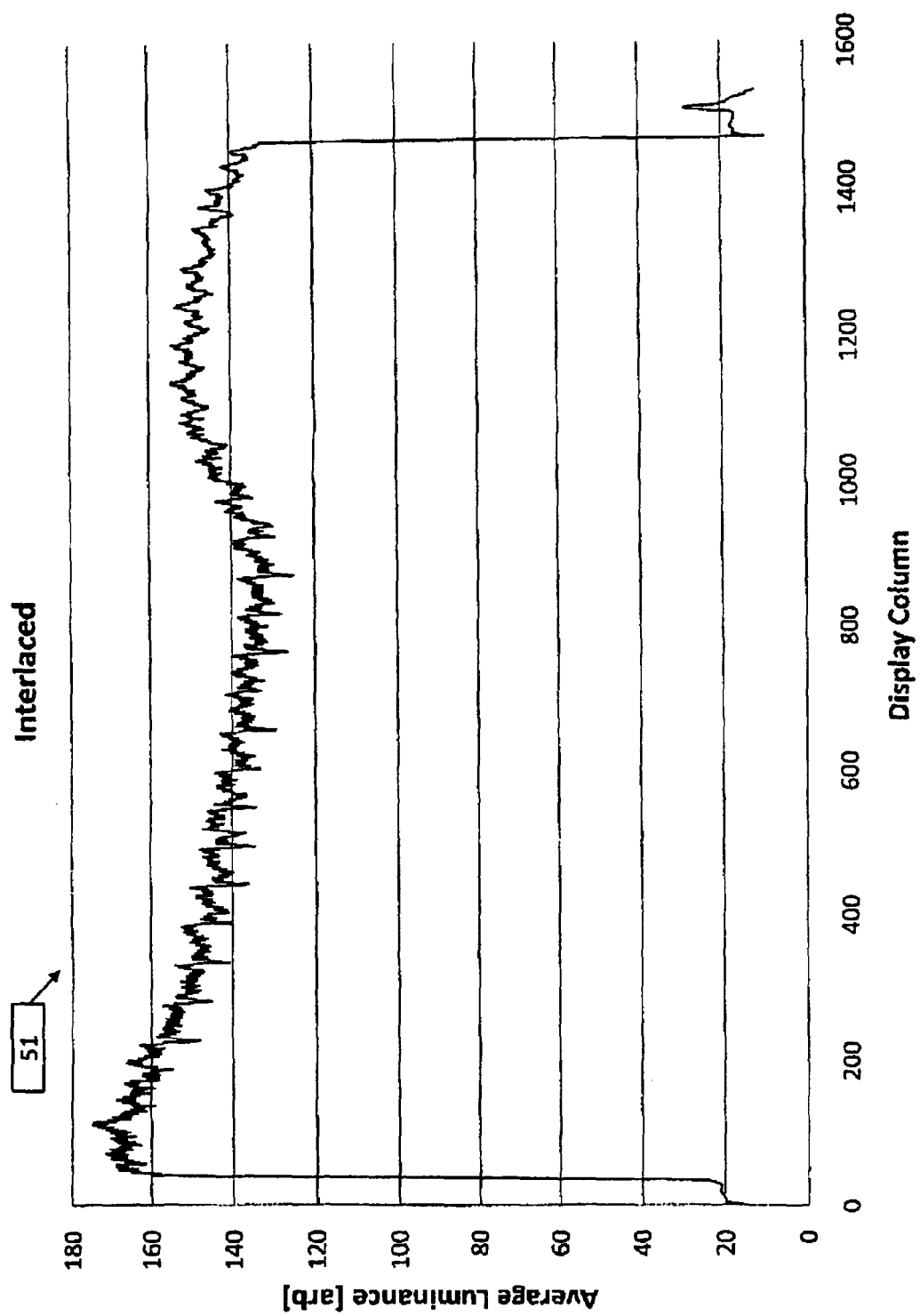

FIGS. 8a and 8b are graphs showing improved average luminance vs display column for the first simple interlacing pattern of FIG. 7. The graph 50 in FIG. 8a shows the average luminance vs display column results for a display printed using swathes as described in FIGS. 4a and 4b. The graph 51 in FIG. 8b shows the average luminance vs display column results for a display printed using swathes using the first interlacing pattern of FIG. 7. As can be seen the results in FIG. 8b show a smoother output.

Figure 9:
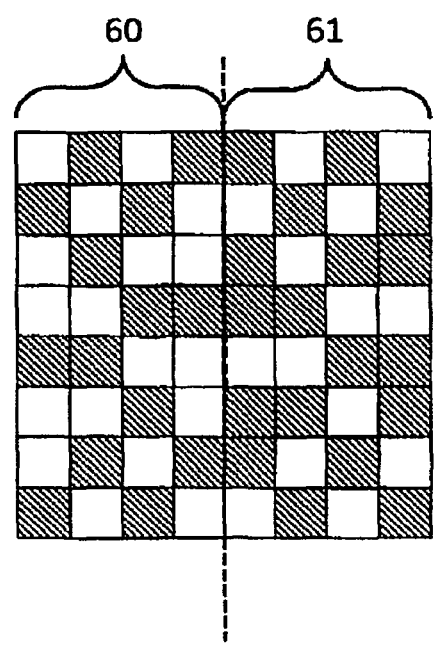
FIG. 9 is a diagram showing a two region interlacing pattern, according to a third embodiment of the present invention.
Figure 10:
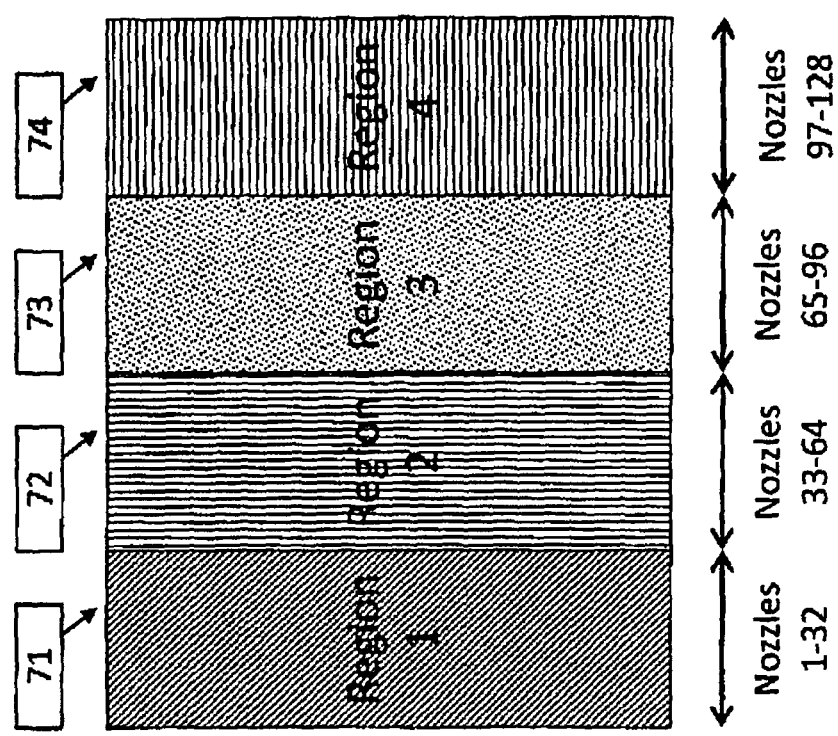
FIG. 10 is a diagram showing a four region interlacing pattern, according to a fourth embodiment of the present invention.

As even a 5% drop in pixel brightness can be noticed by the human eye, but "speckling" swathe-line and edge effects across the panel may mitigate their effects down towards zero. FIGS. 9 and 10 describe simply defined interlacing patterns that mitigate both swathe edge and swathe line effects.

FIG. 9 is a diagram showing a two region interlacing pattern, according to a third embodiment of the present invention. In this example, the left hand side of the randomized pattern 60 is exactly the inverse (or opposite) of the right hand side of the pattern 61 which allows overlapping of the print patterns 60, 61 without missing or double printing pixels. For example, when using a print head with 80 nozzles, the two halves of the print pattern 60, 61 are 40 nozzles width wide.

The pattern in each half size section is formed using the follow steps:

1. In region 1 (60), randomly select a half of the locations, with no constraints on choice.

2. In region 2 (61), select the remaining locations that have not been previously chosen in step 1 above.

The method steps involved in printing all the swathes in the display using this 50/50 print pattern are as follows:

1. In a first print pass, direct the printer to print the right hand side of the pattern 61 first. This will create a first (40 nozzle width) print region completed using only the right hand side of the pattern 61.

2. In a second print pass, direct the printer to print down the whole pattern 60, 61 by moving to the right by a distance of a 40 nozzle width. This results in the first 40 nozzle-width print region being completely filled and leaving a second (40 nozzle-width) region again filled only by the right hand side of the pattern 61.

3. In a third print pass, again off set the location of the print head by a 40 nozzle width and print down the whole pattern 60, 61. This results in the second region being completely filled and leaving a third (40 nozzle-width) region again filled only by the right hand side of the pattern 61.

4. Repeat step 3 until the last full width swathe is printed.

5. Off set the print nozzle location by 50% and print the last half swathe again, but this time with only with the left hand side of the pattern 60.

This method can in principle be expanded so that any number of neighboring panels overlap one another, rather than just two panels as shown in all the examples about, i.e. four panels overlapping, where each panel overlaps the previous one by ¾ of its size.

FIG. 10 is a schematic diagram showing a four region interlacing pattern, according to a fourth embodiment of the present invention.

There is shown a pattern 70 to be printed by a 128 nozzle print head which is split into four regions 71, 72, 73, 74, wherein each region 71, 72, 73, 74 is 32 nozzles wide. Each region 71, 72, 73, 74 to be printed is a display consisting of a rectangular array of pixel wells all of which need to be filled once and once only during the print run.

The print head passes over each pixel four times, shifted by ¼ of its total length (i.e. 32 nozzles) between each pass. In each pass, the same pattern of pixels is printed in such a way that after four passes over each pixel, all pixels are filled once and once only.

The individual pattern in each region 71, 72, 73, 74 is formed using the follow steps:

1. In region 1 (71), randomly select a quarter of the locations, with no constraints on choice. Therefore 25% of all possible pixels which this region 71 passes over are printed. These are randomly distributed throughout the region 71.

2. In region 2 (72), randomly select a quarter of the available locations, with the constraint that none of the locations previously chosen in step 1 above can be chosen in this step. Therefore 25% of all possible pixels which this region 72 passes over are printed. These are randomly selected, but do not include any pixels printed by region 1 (71).

3. In region 3 (73), randomly select a quarter of the available locations, with the constraint that none of the locations previously chosen in steps 1 and 2 above can be chosen in this step (that is select 50% of the remaining locations). Therefore, 25% of all possible pixels which this region 73 passes over are printed. These are randomly selected, but do not include any pixels printed by regions 1 & 2 (71, 72).

4. In region 4 (74), select the remaining locations that have not been previously chosen in steps 1, 2 and 3 above. Therefore, 25% of all possible pixels which this region 74 passes over are printed. These are the remaining 25% of pixels not printed by regions 1, 2, or 3 (71, 72, 73).

The random selection described above need not be truly random. The selection may be made using a pseudo-random or quasi-random sequence, or other sequence which appears random to the human eye but which is not truly random. Thus any area of the devices over which Region 1+Region 2+Region 3+Region 4 all successively pass over, shifted by the correct 32 nozzles, will by definition have all pixels printed once and once only.

The left and right parts edges of any display thus have smaller subsets of this pattern to maintain correct printing across all areas, as described with reference to FIGS. 11a and 11b following.

Figure 11A:
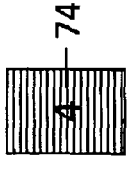
FIGS. 11a and 11b are diagrams which show the method steps involved in printing a full display using a four region pattern and a 128 nozzle print head, according to a fourth embodiment of the present invention.
Figure 11B:
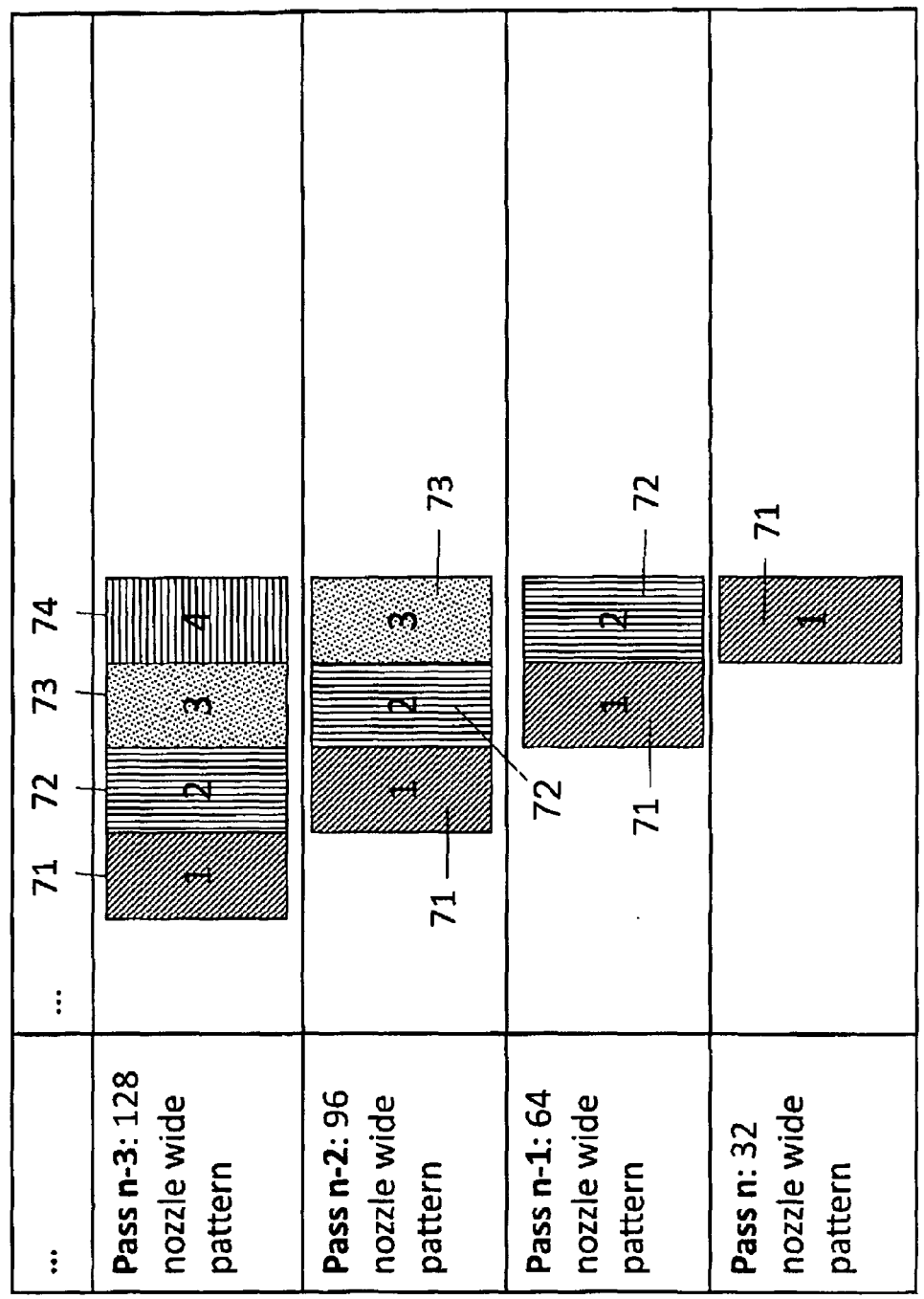

FIGS. 11a and 11b are diagrams which show the method steps involved in printing a full display using a four region pattern and a 128 nozzle print head. There is shown in FIGS. 11a and 11b the method steps "Pass 1" to "Pass N" which are involved in printing all the swathes in a display using the four region print pattern of FIG. 10 and which are described following:

Pass 1: In a first print pass, direct the printer to print the $4^{th}$ region 74 of the pattern 70 first. This will create a first (32 nozzle-width) panel completed using only this $4^{th}$ region 74 of the pattern 70.

Pass 2: In a second print pass, direct the printer to move along by a 32-nozzle distance and print down the $3^{rd}$ and $4^{th}$ quarter print pattern regions 73, 74 only. This will result in the first (32 nozzle-width) panel being half filled and a second (32 nozzle-width) panel which is again only 25% complete.

Pass 3: In a third print pass, direct the printer to move along by a further 32-nozzle distance and print down the $2^{nd}$, $3^{rd}$ and $4^{th}$ quarter print pattern regions 72, 73, 74 only. This will result in the first (32 nozzle-width) panel now being 75% complete and the second (32 nozzle-width) panel being 50% complete and a new third (32 nozzle-width) panel which is again only 25% complete.

Pass 4: In a fourth print pass, direct the printer to move along by a further 32-nozzle distance and print down the whole print pattern 70. This will result in the first (32 nozzle-width) panel now being 100% complete and the second (32 nozzle-width) panel being 75% complete and the third (32 nozzle-width) panel being 50% complete and a new fourth (20 nozzle-width) panel which is only 25% complete.

Pass 5: Repeat step "Pass 4"

Pass 6: Repeat step "Pass 4"

Pass N-3: Repeat step "Pass 4" until the last full width swathe is printed.

Pass N-2: Off set the print nozzle location by 25% (32 nozzles width) and print the $1^{st}$, $2^{nd}$ and $3^{rd}$ region 71, 72, 73 print patterns only.

Pass N-1: Off set the print nozzle location by 25% (32 nozzles width) and print the $1^{st}$ and $2^{nd}$ region 71, 72 print patterns.

Pass N: Off set the print nozzle by 25% (32 nozzles width) and print the $1^{st}$ region 71 print pattern, thus finishing off the printing of the last 25% of the last swathe.

Figure 5:
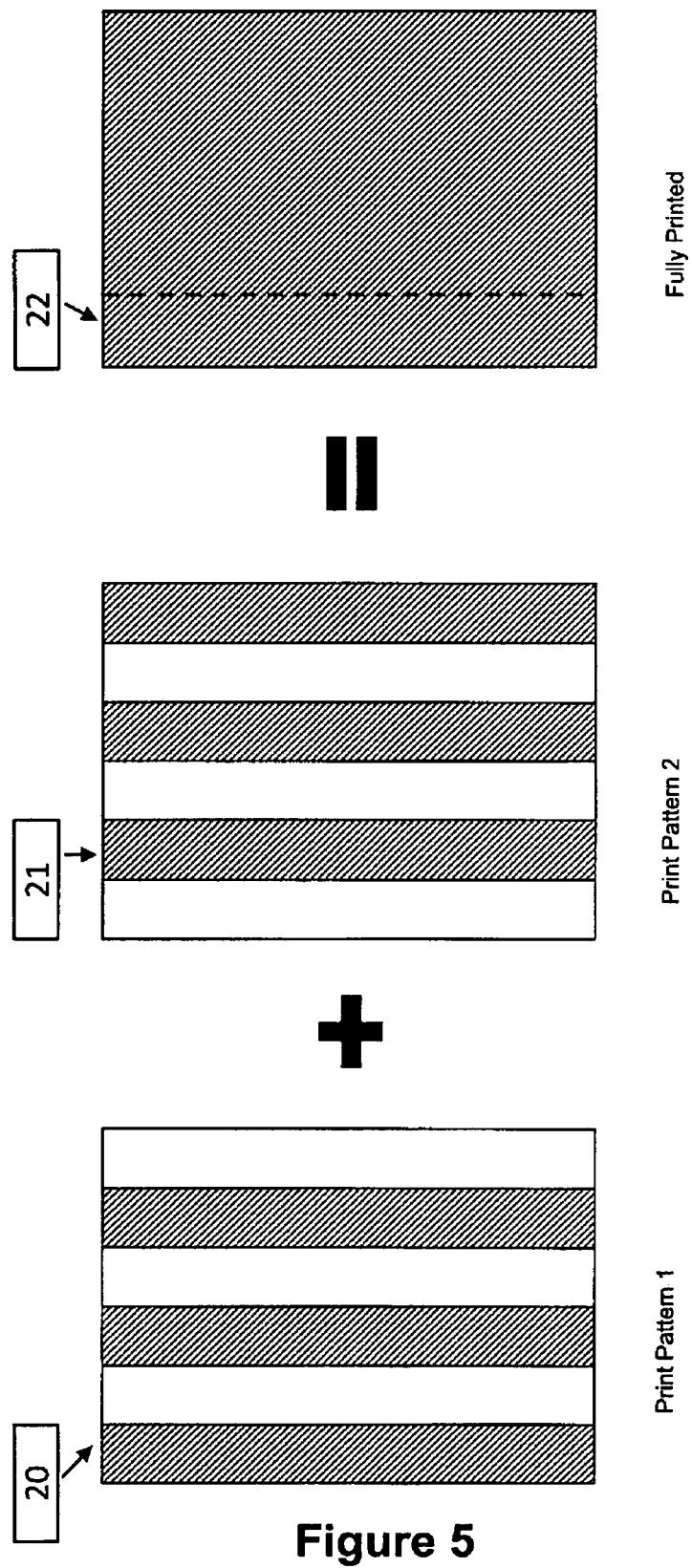
FIG. 5 is a diagram showing the printing of swathes using an on-off interlacing pattern as known in the art.

The interlacing of print panels as described above has been shown to result in a significant improvement in the printed display quality, as can be seen from the results obtained using simple interlacing (FIGS. 5a and 5b). Further, it has been found that using the fully randomized two region or four region methods described in embodiments 2 and 3 above, results in even greater improvements in display quality.

However, the more times you have to travel over the same area to print, the longer it takes to print a panel, as can be understood from the methods described previously. So the increased in quality achieved with a larger number of interlacing patterns or repeats is a compromise with the overall time it takes to print the display itself. A trade-off position needs to be found in practice.

Normally it is desirable to print each location once and once only (when using PEDOT for example), but in some applications when using other materials, a location may need to be repeatedly printed in order to "fill" the location. However it is still of great benefit to print into each locations with different nozzles in order that damaged nozzle effects are mitigated. Therefore, the same rules governing the patterns above still apply, that it must be ensured that print locations are not under, or over, filled by using a regular repeating randomized pattern.

While this invention has been particularly shown and described with reference to preferred embodiments thereof, it will be understood by those skilled in the art that various changes in form and details may be made therein without departing from the scope of the invention as defined by the appended claims.

The invention claimed is:

1. A method of fabricating an organic electronic device using ink jet printing by printing interlaced patterns in adjacent swathes, each swathe comprising a plurality of columns, the columns having sets of print locations, the method comprising:
providing a print head including at least first and second nozzle regions;
generating at least first and second random swathe patterns for a first swathe by randomly defining print locations from the sets of print locations to be filled in a first print pass by said first nozzle region of the print head, said first nozzle region comprising a first plurality of nozzles, and in an at least second print pass by said second nozzle region of the print head, said second nozzle region comprising a second plurality of nozzles that is different from the first plurality of nozzles, wherein the number of print locations to be filled in each pass is less than the total number of print locations in each column;
in a first print pass of the print head, depositing an ink from the first nozzle region into the print locations defined to be filled in the first pass, the first print pass using only the first nozzle region to deposit into the print locations defined to be filled in the first pass;
in the at least second print pass of the print head, depositing an ink from the at least second nozzle region into the print locations defined to be filled in the at least second pass, the second pass following the first pass and using only the second nozzle region to deposit into the print locations defined to be filled in the second pass;
regularly repeating the at least first and second random swathe patterns for an at least second swathe;
in a first additional print pass of the print head, depositing the ink from the first nozzle region into print locations defined to be filled in the first additional pass;
in an at least second additional print pass of the print head, depositing the ink from the at least second nozzle region into print locations defined to be filled in the at least second pass;
wherein the second print pass of the print head overlaps the first print pass of the print head;
wherein the at least second additional print pass of the print head overlaps the first additional print pass of the print head;
wherein after all print passes are complete, all randomly defined print locations in the adjacent swathes have been filled in an interlaced pattern.

2. A method according to claim 1, further comprising depositing an ink into further sets of locations in the column using between 2 and N print passes, where N is a positive integer greater than 2 representing the total number of print passes, and wherein after N print passes, all locations in the column have been printed.

3. A method according to claim 1, wherein after all print passes, all locations in the column have been printed once only.

4. A method according to claim 1, wherein the first set of locations plus the second set of locations is equal to the total number of locations in the column.

5. A method according to claim 1, wherein the number of nozzle regions used to fill all locations in the column is equal to the number of print passes needed to fully print the column.

6. A method according to claim 1, wherein 50% of the locations in a swathe are printed in the first print pass.

7. A method according to claim 6, wherein 50% of the locations in the swathe are printed in the second print pass.

8. A method according to claim 1, wherein 25% of the locations in a swathe are printed in the first print pass.

9. A method according to claim 8, wherein 50% of the locations in the swathe are printed in a second print pass.

10. A method according to claim 9, wherein 75% of the locations in the swathe are printed in a third print pass.

11. A method according to claim 10, wherein all locations in the swathe are printed after all print passes.

12. A method according to claim 1, wherein up to 128 nozzles are used in each of the first or any subsequent print passes.

13. A method according to claim 12, wherein 80 nozzles are used in each print pass.

14. A method according to claim 13, wherein each nozzle has a diameter between 10 μm and 100 μm.

15. A method according to claim 12, wherein each nozzle has a diameter between 10 μm and 100 μm.

16. A method according to claim 12, wherein the pitch between adjacent nozzles is between 50 μm and 100 μm.

17. A method according to claim 1, wherein the ink is a conductive material.

18. A method according to claim 17, wherein the conductive material is a conductive organic material.

19. A method according to claim 18, wherein the conductive organic material is selected from the group consisting of: light emitting polymer (LEP), Interlayer, polyethylene-dioxythiophene (PEDOT), and polystyrene-sulphonate-doped polyethylene-dioxythiophene (PEDOT:PSS).

20. A method according to claim 17, wherein the ink further comprises a solvent selected from the group consisting of: cyclohexylbenzene, an alkylated benzene, toluene, and xylene.

21. A method according to claim 1, wherein the locations are pixels.

22. A method as in claim 21, wherein the pixels are defined by an electrode.

23. A method according to claim 22, where the pixels are in wells.

24. A method according to claim 23, in which the wells are defined by a resistive material.

25. A method according to claim 22, where the pixels are in channels.

26. A method according to claim 25, in which the channels are defined by a resistive material.

27. A method according to claim 21, where the pixels are in wells.

28. A method according to claim 27, in which the wells are defined by a resistive material.

29. A method according to claim 21, where the pixels are in channels.

30. A method according to claim 29, in which the channels are defined by a resistive material.

31. A method according to claim 1 in which the first set of locations forms a random pattern, and the second of locations forms a pattern which is the inverse of said random pattern.

32. A method according to claim 1, wherein the organic electronic device is an organic light emitting diode.

* * * * *